Oct. 2, 1962 J. PAPPIS ETAL 3,056,938

MICRO-MOLECULAR RESISTOR

Filed Dec. 24, 1959 2 Sheets-Sheet 1

INVENTORS:
JAMES PAPPIS
ROBERT E. STAPLETON
BY
Alexander & Slater
Att'ys.

Oct. 2, 1962 J. PAPPIS ETAL 3,056,938

MICRO-MOLECULAR RESISTOR

Filed Dec. 24, 1959 2 Sheets-Sheet 2

INVENTORS:
JAMES PAPPIS
ROBERT E. STAPLETON

BY Alexander & Slater

ATTYS

United States Patent Office 3,056,938
Patented Oct. 2, 1962

3,056,938
MICRO-MOLECULAR RESISTOR

James Pappis, Westwood, and Robert E. Stapleton, South Acton, Mass., assignors to Trionics Corporation, Madison, Wis., a corporation of Illinois Filed Dec. 24, 1959, Ser. No. 861,831
2 Claims. (Cl. 338—309)

This invention relates to electronic circuit components, more particularly, it relates to a process for forming electrical components within solid insulating materials, and in addition it relates to the component devices thus formed.

Electronic circuitry such as is found in control and communications systems requires complex sub-systems which utilize resistors of different ohm values connected within the circuit. Heretofore, resistors have been prepared with leads at either end which are soldered into the circuits or connected on printed circuit boards by means of solder. Considerable handwork and frequently expensive assembly tools are required to connect these numerous resistors into position within the circuit. In order to facilitate this soldering technique, relatively long metallic leads must be provided at the two ends of each of these resistors. Miniaturization of electronic circuits is limited by the necessary room for soldering these leads to the appropriate junctions in the circuit.

The conductive path in a conventional resistor is comprised of a small cylinder of carbon or other resistive material. This material must be capsulated within insulating materials, and the ends sealed against moisture and the damaging effects of exposure to the atmosphere. As a consequence, there is a minimum practical size resistor core which may be fabricated, connected to wire leads, and then capsulated.

In still another part of the electronic art there is need for placing electrical conducting paths through gastight materials such as ferroelectric materials, ferromagnetic materials, semi-conductor materials, ceramic materials, organic polymer materials, and other insulating materials. Prior practice to provide these conducting paths has required that a ceramic to metal or polymer to metal seal be formed about the imbedded electrical conducting structure. Regularly, these metal to ceramic and metal to polymer seals have proven troublesome when very low vacuum must be maintained with respect to one side of of the assemblage such as is required, for example, in vacuum tubes generally and in certain vacuum measuring instrumentation.

Our invention provides a process wherein a conductive path may be formed in situ with a normally non-conducting or insulating material, such as a ceramic or a ferroelectric material or an intermetallic or semi-conductor material or an organic polymer. Moreover, our invention provides a process and a resulting product which may be constructed to have a resistance of specified value, including very low resistances suitable for electrical conducting paths.

One subject of our invention is to provide an electrical conducting path through an insulating or high dielectric material.

A second object of our invention is to provide a means of forming conductive paths having a specified ohmic resistance value within a normally non-conducting substrate.

Still another object of our invention is to provide a means of forming an electrical conducting path through a normally non-conducting high dielectric material wherein a perfect gas seal at the junction of the non-conducting material and the conducting path is required.

These and other objects and advantages of our invention will be apparent from the following description, specifications and drawings.

Our invention is, briefly, an electronic component or device and the process of providing the component which comprises an electrical conducting path having a specified electrical resistance formed of sub-oxides distributed in a continuous path between two surfaces of a solid, normally insulating material; and in addition, comprising a process for forming sub-oxide electrical conducting paths within a normally solid, insulating material comprising the steps of preparing the insulating material in thin sections with suitable binder and additives, applying conducting coatings on opposite sides of the thin section and subjecting the section to a high voltage, low current potential between the conducting coatings until dielectric breakdown of the material is accomplished and a continuous resistive, electrical conducting path of sub-oxide is formed in situ.

Our invention is more readily described and understood by referring to the accompanying drawings.

Figure 1:
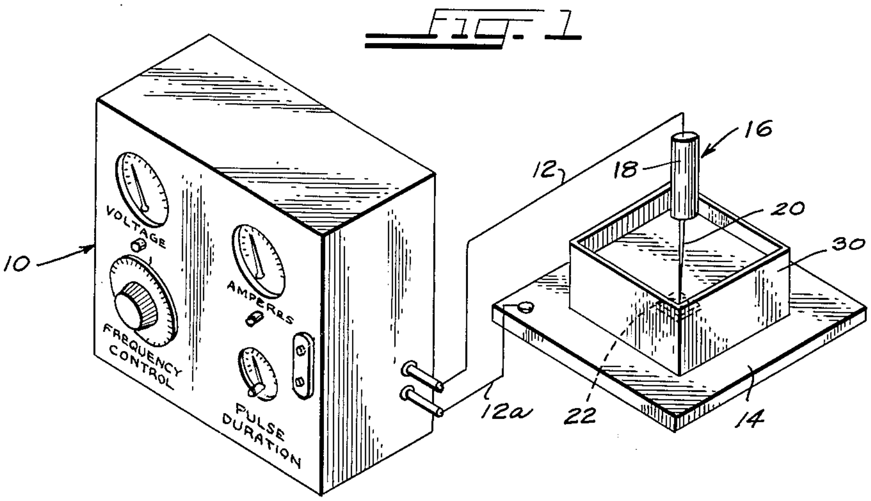
FIGURE 1 illustrates by way of a schematic diagram an apparatus for forming the sub-oxide conducting paths in a solid, insulating material.

The conducting path having a specified electrical resistance may be provided by application of our process to selected normal insulating materials by any one, or combination, of the variations of our process, examples of which are described in detail below.

Normal insulating materials have a resistance of between $10^{10}$ and $10^{20}$ ohms per centimeter at room temperature. By utilizing certain variations in our process we have achieved resistivity of only a few ohms per centimeter at room temperature in continuous paths within normally insulating material.

Examples of preferred materials in which we have achieved remarkable local reduction in resistivity include titanates, niobates, stannates, zirconates and tantalates of suitable light metals, such as barium, calcium, magnesium, and strontium, which may be referred to as ferro electric bivalent metal salts having the perovskite or the ilmenite structure, and their carbides, hydrides, nitrides, sulfides and halides of said metals and non-conductive, intermetallics, metal oxides, ferrites including ferromagnetic materials and polymeric materials.

Many of these materials described above are ferroelectric materials; most of the specific examples, to be described below, utilize particular ferroelectric materials because of their convenience in fabrication. However, the non-ferroelectric and other insulating materials are available and practical to use in our process in which we have achieved substantial reduction in resistivity along paths within these insulating materials. To be included in this latter class are most metal oxides, ferrites, semiconductor materials, intermetallic compounds and carbides, nitrides, sulfides and halides of many metals and intermetallics.

With reference to the ferroelectric materials, and certain of the metal oxides, insulating substrate wafers or disks may be conveniently prepared by mixing electronic grade or C.P. grade oxides in finely powdered form with polyvinyl alcohol or polyvinyl acetates, or other suitable binder materials, then forming the mix into desired thin, sectioned shapes under high pressure and curing in a moderate temperature oven. The temperature of the oven must be adjusted to suit the specific material, but a satisfactory curing temperature, for example, for barium titanate is 2500° F. The above described process is conventional and well known in the electronic-ceramic arts. In some variations of our process, the disks or substrate are not cured prior to introduction of foreign ions and other treatment described below. However, with most materials we have found them more convenient to handle if they are cured at elevated temperatures prior to final processing.

I

A specific example of the application of our process is as follows: A disk of very pure electronic grade barium titanate ($BaTiO_3$) 0.75 inch in diameter and 20 mils in thickness was prepared by the conventional, ceramic techniques. After cure firing until approximately zero apparent porosity, a highly conductive silver paint was applied to a small area 0.05 inch in diameter, on immediately opposite areas on both faces of the disk. The disk was placed in a non-conducting container which was partly filled with silicone oil (Dow 710). The container was provided with an electrode protruding through the bottom thereof. One metallized surface of the barium titanate disk was placed in contact with this electrode; the second electrode of the high potential source comprising an insulated, pointed, conducting probe was placed in contact with the metallized area on the opposite side of the disk. A direct current voltage was connected through appropriate insulated wires to the two electrodes. The voltage was gradually increased to approximately 10,000 volts at a few micro-amperes. This voltage was applied for approximately ten seconds; the resulting breakdown path upon subsequent measurement at voltages less than 100 volts exhibited 100 megohms resistance.

Figure 2:
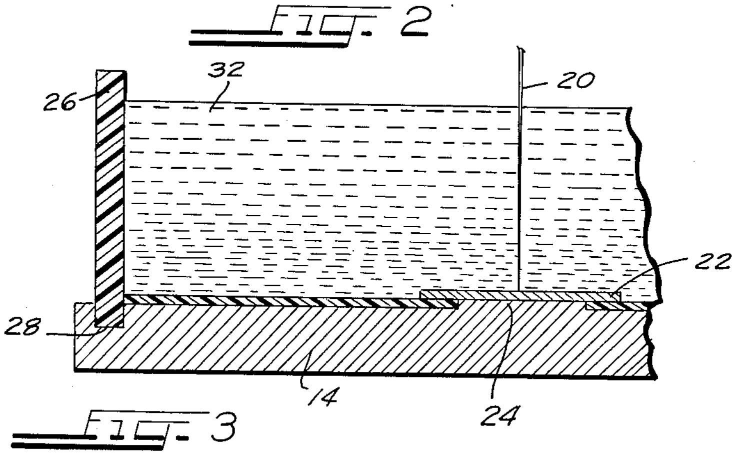
FIGURE 2 is a cross section view of a portion of the apparatus illustrated in FIGURE 1 taken on line 2—2.

FIGURE 1 illustrates an apparatus which we found convenient for performing the electro-forming step of our process. It is comprised of a power supply 10 which is capable of delivering high voltage, low amperage pulses of electrical energy at D.C. as well as through a frequency range up to 100 kilocycles. The power supply contains a timing circuit which upon appropriate adjustment limits the duration of the electro-forming pulses from a few milliseconds to ten seconds. Both voltage and current in the power supply may be controlled independently by means of conventional circuitry. After the various controls have been adjusted to yield the combination of frequency, pulse duration, voltage, and current, which is desired for a particular application, a switch is closed and the power supply delivers its surge of power having the preselected characteristics. Two leads 12 and 12*a* adapted to conduct high voltages, up to 20,000 volts, are attached to the output terminals of the power supply 10. One lead 12*a* is attached to a base plate 14; the other lead 12 is attached to a probe 16 having a well insulated handle 18 and a projecting long needlelike conducting probe 20. FIGURE 2 is a cross sectional view of the electro-forming apparatus taken along the plane 2—2. The insulating material 22 in which a resistor is to be formed is placed on a metallic boss 24 which is electrically connected to the base plate 14. The boss 24 makes ready contact with one of the conducting coatings on the insulating material 22. Polymer sections 26 are inserted into grooves 28 within the base plate 14 to form a container 30 into which a high dielectric constant fluid, such as silicone oil 32 is placed. The insulating material 22 in which the conducting path is to be formed, and the lower portion of the probe conductor 20 are submerged below the high dielectric constant fluid.

Other desired resistance values were formed within the titanate disk by applying a lower voltage and higher amperage current. In the present specific example, the same two metallized surfaces were again connected electrically to the power source through leads 12 and 12*a*, and a second electro-forming cycle this time utilizing only 600 volts at 30 milli-amperes was applied to the 100 megohm resistance path for one second. The resulting permanent conductive path had, when subsequently measured with a lower voltage, only 10 megohms resistance. This process was again repeated utilizing 800 volts at 40 milli-amperes for one second. The resulting permanent conductive path had a resistance of 10,000 ohms. The process was repeated still again utilizing 1,000 volts and 50 milli-amperes; the permanent resistance of the path was reduced to 5,000 ohms. Table 1 tabulates the above values and illustrates that by variation of voltage and amperage in the electro-forming step of the process, a preselected resistance may be induced in the sub-oxide conducting path formed within the high dielectric material.

*Table I*

| Forming pulses | | Final resistance in ohms at room temperature measured at less than 100 volts |
|---|---|---|
| Voltage | Current (amperes) | |
| 10,000 | 10 microamperes | 100 megohms. |
| 600 | 30 milliamperes | 100,000 ohms. |
| 800 | 40 milliamperes | 10,000 ohms. |
| 1,000 | 50 milliamperes | 5,000 ohms. |

By re-firing the electro-formed resistance path in the disk in a suitable furnace with normal atmosphere, the resistance value may be again increased to near its original value in the undisturbed insulating material. Temperatures of about 1,500° F. have shown a tendency to slightly increase the permanent resistance value of the partially reduced titanate electro-formed path. This reverse reaction may be explained by the presence of a normal oxidizing atmosphere at higher temperatures which re-oxidizes the titanate or complex sub-oxide formed by the electro-forming step, thus increasing its permanent resistivity. The electro-forming process, on the other hand, reduces the complex oxide removing the oxygen, thus forming a sub-oxide conducting path which exhibits a much lower dielectric constant and therefore lower resistance values than the undisturbed, oxidized adjacent insulating materials. Variations on the above specific example of our process will permit the attainment of much lower permanent resistance values in the sub-oxide conducting paths formed within the insulating materials.

Figure 3:
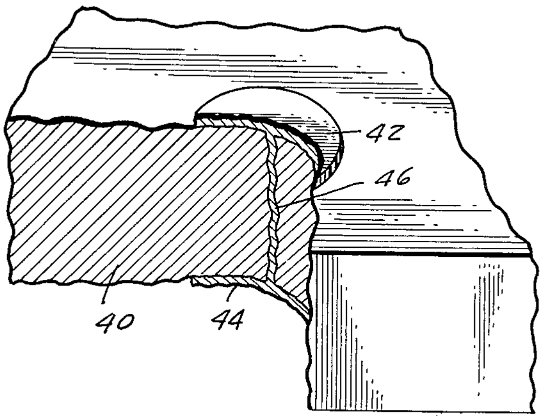
FIGURE 3 is a sectional view of a typical conductive path formed within a thin section of an insulating material.

FIGURE 3 is a sectional view of a barium titanate disk 40 on which conducting coatings 42 and 44 have been applied. The disk 40 has been broken to expose the breakdown path 46 which contains the resistive sub-oxide materials. The path, as illustrated in FIGURE 3 at 46, is characteristic of the path, such as would be formed by a single large voltage pulse.

Figure 4:
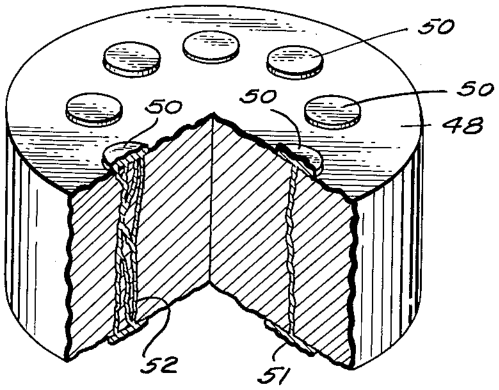
FIGURE 4 is a sectional view of a solid insulating material wherein a plurality of conductive paths have been formed.

FIGURE 4 is a sectional view of still another barium titanate disk 48 in which several conductive paths of different ohm values have been formed beneath the conductive coatings 50. The sectional view of FIGURE 4 illustrates the complex structure of the paths 52 formed between two conducting coatings 50 and 51 when subsequent electro-forming and tempering by re-heating have been applied to the same disk. By the use of these two reverse processes; that is, the electro-forming process which creates a sub-oxide conducting path, and the oxidizing heat treatment, which reoxidizes the lower resistance sub-oxide material, any resistance value may be induced within a thin section of normally insulating material.

Figure 5:
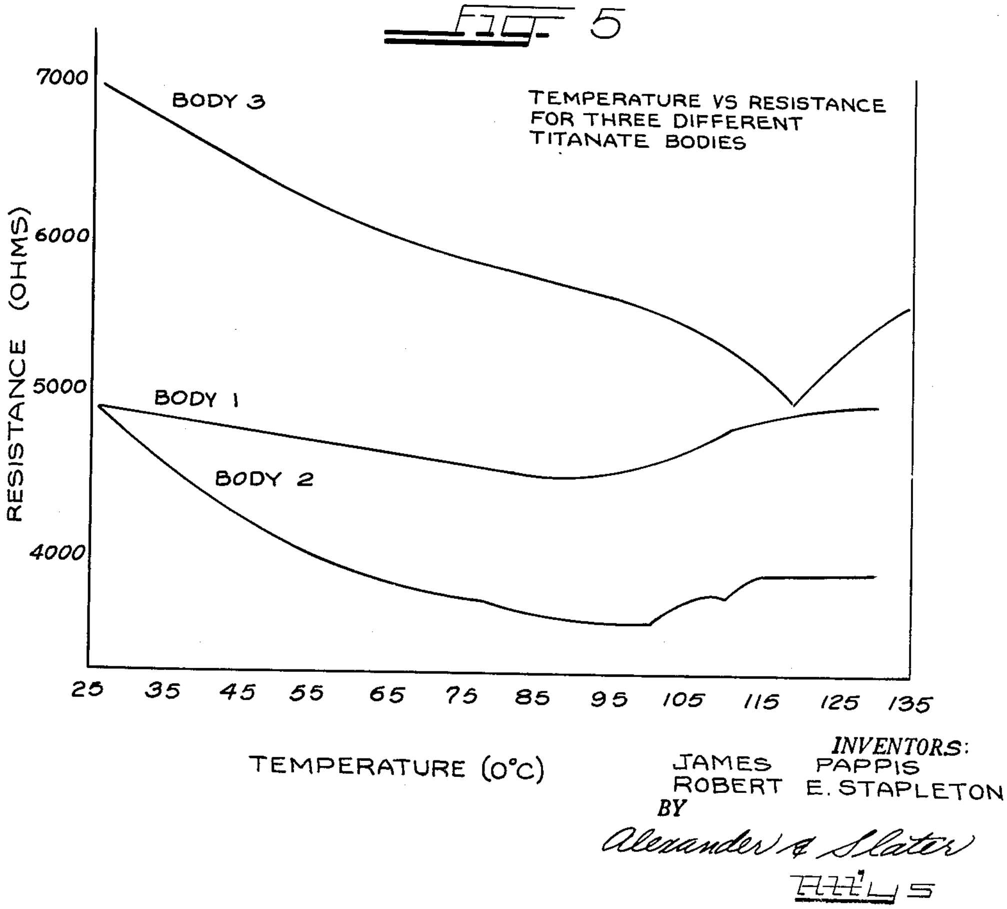
FIGURE 5 is a graph showing the resistance vs. temperature curves of three different sub-oxide electrical conductive paths formed by our process.

FIGURE 5 shows the resistance values of three typical conductive paths suitable for use in conventional electronic circuits formed within a barium titanate substrate according to the description above and measured at various voltages for different ambient temperatures. The stability of the resistance values of the three different samples measured are relatively linear with respect to temperature between room temperature and 135° centigrade. This range of temperatures includes the normal operating temperature range of many electronic devices.

II

Another variation of our process includes the step of adding foreign ions to the normally insulating substrate prior to the electro-forming step. Metallic salts, examples of which are copper nitrate, cobalt nitrate, nickel sulfate, ferrous chloride and zinc sulfate which may be conveniently introduced into the barium titanate substrate prior to its heat curing by the application of saturated water solutions of the selected metal salts. The foreign ion solutions may be introduced into the substrate in trace amounts by application of the solution to the surface or one region of the surface of a disk. Larger quantities may be introduced into the substrate by mixing some of the powdered metal salts with the insulating material and the binder. The permanent resistance values achieved after the electro-forming step in the insulating substrate are consistently smaller than when no foreign metallic ions are added to the substrate. Concentration of the foreign ions may be varied from trace quantities achieved by application of the solution to a surface up to 30 mole percent which may be obtained by mixing suitable quantities of the metal salts with the substrate material prior to heat curing.

In one embodiment of our invention the barium titanate wafer or disk, formed as described in I above and having the same dimensions, was placed in a container of saturated copper nitrate aqueous solution at room temperature for twelve hours, subsequent to the heat curing step and prior to the electro-forming step of our process. It was then removed from the copper nitrate solution and dried at a slightly elevated temperature for several hours. Conducting coatings were placed over small areas on opposite sides of the disk and the electro-forming process, as described in I, undertaken utilizing a one second pulse of 10,000 volts at 10 micro amperes. The final resistance value in the suboxide path thus formed was 10 megohms at room temperature.

The foreign metal ions appear, upon examination of the conductive path to be reduced and arranged by action of the high voltage pulse into a substantially continuous conducting path which exhibited a very much reduced resistance value compared with the adjacent undisturbed insulating substrate materials.

III

Still another variation of our process includes the addition of metal ions which have higher valence states than titanium ($Ti^4$). Examples of these are lead ($Pb^{+5}$), vanadium ($V^{+5}$), Tantalum ($Ta^{+5}$) and Chromium ($Cr^{+6}$).

These heavy metal ions may be introduced as metal oxides, or as titanates, niobiates or chromates, and as elements within other complex salts and compounds. Many of these heavier ions form only sparingly soluble compounds and therefore introduction into the substrate by application of saturated solutions does not in many instances carry sufficient quantities of the heavier ions into the substrate to be effective. It has been found convenient to mix the compounds bearing these heavy metal ions with the binder material prior to the preparation and heat curing of the substance. The presence of these heavy metal ions supply a large number of electrons within the suboxide path and generally tends to reduce the resistance values of the electro-formed suboxide paths.

One specific example of this last described embodiment of our invention introduced a small quantity, less than one-tenth of one percent by weight, of tantalium chromate into polyvinyl alcohol prior to mixing it with finely ground barium titanate. The mixture was pressed into 20 mil thick disk and then heat cured. Conductive coatings were applied in small areas at each side of the disk and the electro-forming step was then undertaken with a series of one second duration pulses of 10,000 volts 10 micro amperes at a frequency of 10,000 cycles per second. The resulting conductivity path showed a resistance of only a few ohms at room temperature when measured with voltages less than 100 volts. Subsequent sustained application of small potentials across the disk did not result in any detectable alteration in the value of the resistivity. Such a conductivity path is readily applicable as a substitute for metal to ceramic seals, such as utilized in vacuum tubes and other electronic devices requiring high vacuum on one side of the assemblage.

IV

Yet another embodiment of our process which affords the construction of a novel electronic device is described below. It has long been known that certain reduced metal particles or ions will readily migrate through otherwise solid materials upon the application of a direct current potential. Silver is notorious for its migration through the interstices of other solid substances. Taking advantage of this fact, a ceramic insulating disk prepared with the technique described in I above which contained a mixture of the titanates and niobates fabricated into a pressed disk and cured to zero apparent porosity was heavily coated on both sides with a metallic silver bearing conducting paint. A low voltage direct current potential was applied across the disk for an extended period of time. Silver ions migrated into the material and were disbursed in considerable quantity therethrough. The insulating properties or resistivity of the disk was reduced one order of magnitude compared with similar disks that did not have metallic silver electrically disbursed therein.

Application of the electro-forming step of our process as described in I formed a suboxide path having a very low resistivity in which there was incorporated a substantial amount of reduced silver metal. Accordingly, a conductive path having a very low resistance was formed through the insulating material which was mounted in an electronic device and readily utilized in place of metal conductors sealed within ceramic and glass insulators. Care must be taken in applying such a device so that the silver is not induced to migrate out of the disbursed state and collect at one end of the conducting path where it may change the properties of the circuit by shorting or interacting with other materials. However, numerous applications exist in the electronic instrumentation art where the duty cycle is very short and infrequent and substitution of a conducting pathway through a section of ceramic in accordance with our invention for the presently used metal to ceramic seal structures is a distinct improvement.

The above described specific examples are intended merely to illustrate the various facets in certain selective embodiments of our invention, the scope of which it is intended shall be limited only by the following claims.

We claim:

1. An electronic resistor comprising a solid barium titanate wafer having conducting coatings on opposite surfaces, and a resistive suboxide conductor connecting the conductive surface coatings through the wafer.

2. The electronic resistor of claim 1 further comprising less than 30 mole percent heavy metal ions disbursed throughout the wafer and the sub-oxide conductor.

References Cited in the file of this patent

UNITED STATES PATENTS

| | | |
|---|---|---|
| 1,238,660 | Field-Frank | Aug. 28, 1917 |
| 1,922,221 | Steenbeck et al. | Aug. 15, 1933 |
| 2,706,326 | Mason | Apr. 19, 1955 |
| 2,729,757 | Goodman | Jan. 3, 1956 |
| 2,731,419 | Goodman | Jan. 17, 1956 |
| 2,742,370 | Wainer | Apr. 17, 1956 |
| 2,906,710 | Kulcsar et al. | Sept. 29, 1959 |